(12) United States Patent
Nawata (10) Patent No.: US 8,599,620 B2
(45) Date of Patent: Dec. 3, 2013

(54) NONVOLATILE SEMICONDUCTOR MEMORY DEVICE

(75) Inventor: Hidefumi Nawata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 13/418,881

(22) Filed: Mar. 13, 2012

(65) Prior Publication Data

US 2013/0070532 A1 Mar. 21, 2013

(30) Foreign Application Priority Data

Sep. 21, 2011 (JP) ................... 2011-205908

(51) Int. Cl.
*G11C 11/34* (2006.01)

(52) U.S. Cl.
USPC ............. 365/185.22; 365/185.17; 365/185.19

(58) Field of Classification Search
USPC ........................ 365/185.22, 185.19, 185.17
See application file for complete search history.

(56) References Cited

U.S. PATENT DOCUMENTS

| | | | |
|---|---|---|---|
| 8,339,857 B2 * | 12/2012 | Edahiro | .................. 365/185.17 |
| 2009/0141557 A1 | 6/2009 | Fujiu | |
| 2011/0007572 A1 | 1/2011 | Ueno et al. | |

FOREIGN PATENT DOCUMENTS

JP 2011-18397 1/2011

OTHER PUBLICATIONS

U.S. Appl. No. 13/169,414, filed Jun. 27, 2011, Yasuhiro Shiino, et al.

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A nonvolatile semiconductor memory device according to an embodiment includes a control unit configured to perform a control of repeating a program operation, and a step-up operation, the program operation being an operation of applying a program pulse voltage to a selected memory cell and applying an intermediate voltage less than the program pulse voltage to first and second non-selected memory cells adjacent to the selected memory cell, and the step-up operation being an operation of increasing the program pulse voltage by a first step-up value. For a first period, the control unit maintains the intermediate voltage to be a constant value. For a second period, the control unit controls the step-up operation such that the intermediate voltage is increased by a second step-up value, and determines the first step-up value on the basis of the second step-up value.

20 Claims, 6 Drawing Sheets

NONVOLATILE SEMICONDUCTOR MEMORY DEVICE

CROSS REFERENCE TO RELATED APPLICATION

This application is based upon and claims the benefit of priority from prior Japanese Patent Application No. 2011-205908, filed on Sep. 21, 2011, the entire contents of which are incorporated herein by reference.

BACKGROUND

1. Field

Embodiments described herein relate to a nonvolatile semiconductor memory device.

2. Description of the Related Art

In a NAND flash memory, data is written in a page basis. One page is defined as memory cells sharing one word line. After the data program operation, a verify read (program verify) operation is performed to determine whether the data is accurately written to the memory cell. As a result of the program verify operation, when it is determined that the data is not written to the memory cell accurately, a program pulse voltage increases in stages (is stepped up) and then the same program operation and program verify operation are repeatedly performed.

When the program pulse voltage is stepped up and then the program operation is performed on one selected memory cell, an intermediate voltage applied to the non-selected memory cells may also be stepped up. In this case, there is a concern that an excessively large number of charges would be injected into the selected memory cell by the influence of the intermediate voltage. When an excessively large number of charges are injected into the selected memory cell, dispersion of the threshold voltage is more than a certain value, which makes it difficult to accurately write data to the NAND flash memory. Therefore, it is preferable to minimize the influence on the selected memory cell by the intermediate voltage applied to the non-selected memory cell.

DETAILED DESCRIPTION

A nonvolatile semiconductor memory device according to an embodiment includes: a memory cell array having electrically-rewritable nonvolatile memory cells arranged therein; and a control unit configured to perform a control of repeating a program operation, a program verify operation, and a step-up operation, the program operation being an operation of applying a program pulse voltage to a selected memory cell in order to write data and applying an intermediate voltage less than the program pulse voltage to first and second non-selected memory cells adjacent to the selected memory cell, the program verify operation being an operation of determining whether the writing of the data is completed, and the step-up operation being an operation of increasing the program pulse voltage by a first step-up value when the writing of the data is not completed. For a first period for which the number of times the program pulse voltage is applied is less than a first value, the control unit maintains the intermediate voltage to be a constant value. For a second period for which the number of times the program pulse voltage is applied is equal to or greater than the first value, the control unit controls the step-up operation such that the intermediate voltage is increased by a second step-up value, and determines the first step-up value on the basis of the second step-up value.

Next, embodiments of the present invention will be described in detail with reference to the accompanying drawings.

First Embodiment

Figure 1:
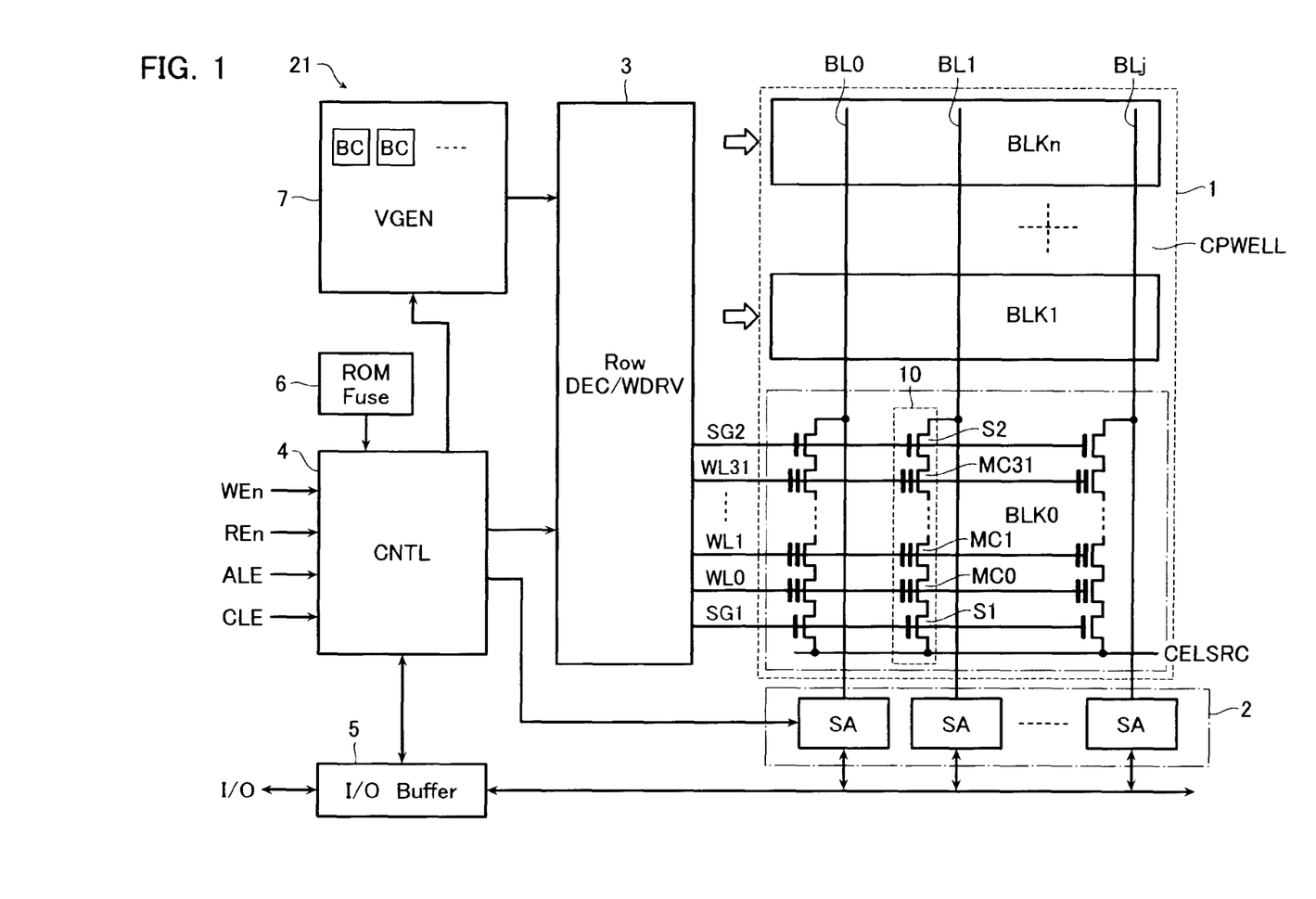
FIG. 1 is a diagram illustrating a schematic configuration of a nonvolatile semiconductor memory device according to an embodiment.

FIG. 1 is a diagram illustrating a schematic configuration of a nonvolatile semiconductor memory device according to a first embodiment. As illustrated in FIG. 1, a NAND flash memory 21 includes a memory cell array 1, a sense amplifier circuit 2, a row decoder 3, a controller 4, an input/output buffer 5, a ROM fuse 6, and a voltage generating circuit 7. The controller 4 forms a control unit for the memory cell array 1.

The memory cell array 1 includes NAND cell units 10 which are arranged in a matrix. One NAND cell unit 10 includes a plurality of memory cells MC (MC0, MC1, . . . , MC31) which are connected in series and selection gate transistors S1 and S2 which are connected to both ends of the memory cells, respectively. Although not illustrated in the drawings, one memory cell MC may have a well-known stacked gate structure. The memory cell MC includes a floating gate electrode and a control gate electrode. The floating gate electrode serves as a charge accumulation layer, and is formed on a gate insulating film (tunnel insulating film) between a drain and a source. The control gate electrode is formed on the floating gate electrode with an inter-gate insulating film interposed therebetween. The control gate electrodes of the memory cells MC in the NAND cell unit are connected to different word lines WL (WL0, WL1, . . . , WL31), respectively.

The source of the selection gate transistor S1 is connected to a common source line CELSRC and the drain of the selection gate transistor S2 is connected to a bit line BL. The gate electrodes of the selection gate transistors S1 and S2 are connected to selection gate lines SG1 and SG2 which are parallel to the word line WL, respectively. A set of the memory cells MC sharing one word line WL forms one page. When multi-value data is stored in the memory cell MC or when the even-numbered bit lines and the odd-numbered bit lines are switched and controlled, the set of the memory cells MC sharing one word line WL may form two or more pages.

As illustrated in FIG. 1, a set of a plurality of NAND cell units 10 sharing the word lines WL and the selection gate lines SG1 and SG2 forms a block BLK, which is a data erasing unit. The memory cell array 1 includes a plurality of blocks BLK (BLK0, BLK1, . . . , BLKn) in the direction of the bit lines BL. The memory cell array 1 including the plurality of blocks is formed in one cell well (CPWELL) on a silicon substrate.

The sense amplifier circuit 2 including a plurality of sense amplifiers SA is connected to the bit lines BL of the memory cell array 1. The sense amplifiers SA form a page buffer for sensing read data and holding written data. The sense amplifier circuit 2 includes a column selection gate. The row decoder 3 (including a word line driver WDRV) selectively drives the word lines WL and the selection gate lines SG1 and SG2.

The data input/output buffer 5 performs data sending and reception between the sense amplifier circuit and an external input/output terminal and receives command data or address data. The controller 4 receives external control signals, such as a write enable signal WEn, a read enable signal REn, an address latch enable signal ALE, and a command latch enable signal CLE, and controls the entire memory operation.

Specifically, the controller 4 includes a command interface or an address holding/transmitting circuit and determines whether supplied data is written data or address data. According to the determination result, the written data is transmitted to the sense amplifier circuit 2 and the address data is transmitted to the row decoder 3 or the sense amplifier circuit 2. In addition, the controller 4 controls, for example, the sequence of a read, program, or erase operation and the voltage to be applied, on the basis of the external control signals.

The voltage generating circuit 7 generates a desired pulse voltage on the basis of the control signal from the controller 4. The voltage generating circuit 7 generates various voltages required for the program operation, the erase operation, and the read operation.

Figure 2:
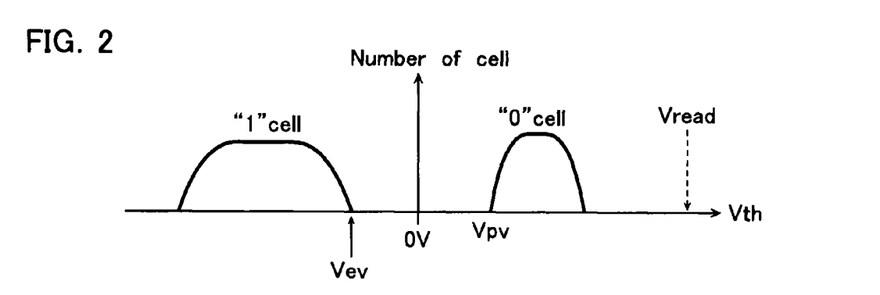
FIG. 2 is a diagram illustrating a relation between data stored in a memory cell and a threshold voltage.

FIG. 2 is a diagram illustrating a relation between a threshold voltage and data stored in the memory cell MC. In the case of two-value data storage, the memory cell MC having a negative threshold voltage is defined as a "1" cell holding logic data "1" and the memory cell MC having a positive threshold voltage is defined as a "0" cell holding logic data "0". An operation to shift the memory cell MC to data "1" state is referred to as an erase operation and an operation to shift the memory cell MC to data "0" state is referred to as a program operation.

[Erase Operation]

In the NAND flash memory, a data erase operation is generally performed in a block basis. In the data erase operation, an erase pulse voltage Vera (about 10 V to 30 V) is applied to the cell well (CPWELL) and a voltage of 0 V is applied to all of the word lines WL in the selected block. Charges in the floating gate electrode of each memory cell MC are released to the cell well by an FN tunnel current and the threshold voltage of the memory cell MC is reduced. At that time, in order to prevent the gate oxide films of the selection gate transistors S1 and S2 from being broken, the selection gate lines SG1 and SG2 are brought into a floating state. The bit line BL and the source line CELSRC are also brought into the floating state.

After the erase operation, a verify read (erase verify) operation is performed to determine whether the threshold voltage of the memory cell MC is equal to or less than an erase verify voltage Vev. The erase operation is performed again according to the result of the erase verify operation. When the erase operation is performed again, the erase pulse voltage Vera is stepped up by a voltage $\Delta$Vera and the voltage Vera+$\Delta$Vera after the step-up operation is used to perform the erase operation.

[Program Operation]

Figure 3:
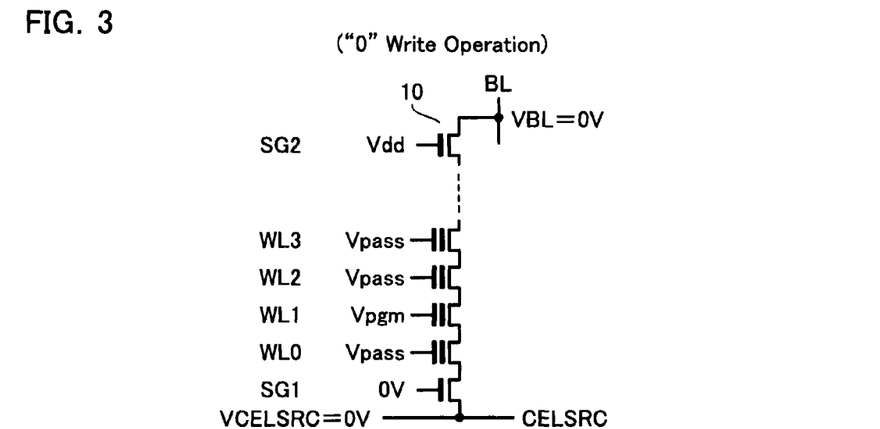
FIG. 3 is a diagram illustrating voltages applied to a NAND cell unit during a program operation.

FIG. 3 is a diagram illustrating voltages applied to the NAND cell unit 10 during the program operation. The program operation is performed in a page basis. During the program operation, a program pulse voltage Vpgm (about 10 V to 25 V) is applied to the selected word line (WL1) in the selected block BLK. In addition, an intermediate voltage Vpass (about 5 V to 15 V) is applied to the non-selected word lines (WL0, WL2, WL3, . . . ) and a voltage Vdd is applied to the selection gate line SG2.

Prior to the program operation, the bit line BL and the NAND cell unit 10 are pre-charged according to write data. Specifically, when data "0" is written, a voltage of 0 V is applied from the sense amplifier circuit 2 to the bit line BL. The bit line voltage is transferred to the channel of the memory cell MC connected to the selected word line WL1 through the selection gate transistor S2 and the non-selected memory cells MC. Therefore, charges are injected from the channel of the selected memory cell MC into the floating gate electrode under the above-mentioned program operation conditions and the threshold voltage of the memory cell MC shifts in the positive direction ("0" cell).

When data "1" is written (program is inhibited, that is, data "0" is not written to the selected memory cell MC), the voltage Vdd is applied to the bit line BL. After the bit line voltage Vdd is reduced by the threshold voltage of the selection gate transistor S2 and is then transferred to the channel of the NAND cell unit, the channel is brought into the floating state. In this way, when the program pulse voltage Vpgm or the intermediate voltage Vpass is applied, the channel voltage is increased by capacitance coupling and no charge is injected into the floating gate electrode. Therefore, the memory cell MC holds the data "1".

Similarly to the erase operation, the program operation is performed again according to the result of the program verify operation, which will be described below. When the program operation is performed again, the program pulse voltage Vpgm is stepped up by a voltage $\Delta$Vpgm and the voltage Vpgm+$\Delta$Vpgm after the step-up operation is used to perform the program operation. The initially applied program pulse voltage is a voltage Vpgm0.

[Read Operation]

The data read operation is an operation of applying a read voltage of 0 V to the word line WL (the selected word line WL1) to which the selected memory cell MC in the NAND cell unit 10 is connected. In addition, a read pass voltage Vread (about 3 V to 8 V) is applied to the word lines WL (the non-selected word lines WL0, WL2, WL3, . . . ) to which the non-selected memory cells MC are connected. In this case, the sense amplifier circuit 2 determines whether a current flows through the NAND cell unit 10 and performs a data determining operation.

[Program Verify Operation]

When data is read, a margin for guaranteeing the reliability of data is needed between the threshold voltage state set in advance and a read voltage of 0 V. Therefore, in the data erase operation and the program operation, control needs to be performed such that there are appropriate margins between a voltage of 0 V and the lower limit Vpv of the threshold voltage distribution of the data "0" and between a voltage of 0 V and the upper limit Vev of the threshold voltage distribution of the data "1" (see FIG. 2). Therefore, in the program operation described above, a verify read (program verify) operation for determining whether the threshold voltage of the selected memory cell MC is equal to or more than the lower limit Vpv is performed after the program pulse voltage Vpgm is applied.

Figure 4:
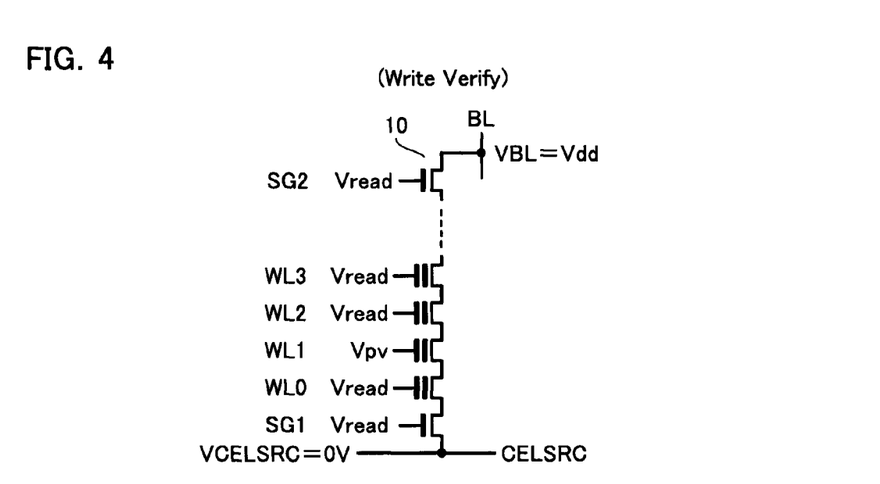
FIG. 4 is a diagram illustrating voltages applied to the NAND cell unit during a program verify operation.

FIG. 4 is a diagram illustrating the voltages applied to the NAND cell unit 10 during the program verify operation. The program verify operation is substantially the same as the read operation described above. That is, the read pass voltage Vread (about 3 V to 8 V) is applied to the word lines WL (the non-selected word lines WL0, WL2, WL3, ...) to which the non-selected memory cells MC are connected and the selection gate lines SG1 and SG2. In addition, the voltage Vdd is applied to the bit line BL and a voltage of 0 V is applied to the common source line CELSRC. The program verify voltage Vpv is applied to the word line WL (the selected word line WL1) to which the selected memory cell MC is connected. In this case, the sense amplifier circuit 2 determines whether a current flows through the NAND cell unit 10 and performs a data determining operation.

When the selected memory cell MC is written to be included in the data "0" state, no current flows through the NAND cell unit 10 even in the program verify operation. On the other hand, when the threshold voltage distribution of the data state, a current flows through the NAND cell unit 10. When it is determined that the selected memory cell MC is written to be included in the data "0" state, writing is sufficiently performed on the selected memory cell MC and the program operation ends. When the selected memory cell MC is not written to be included in the data "0" state, the program operation is performed on the selected memory cell MC again.

[Step-Up Operation]

Figure 5:
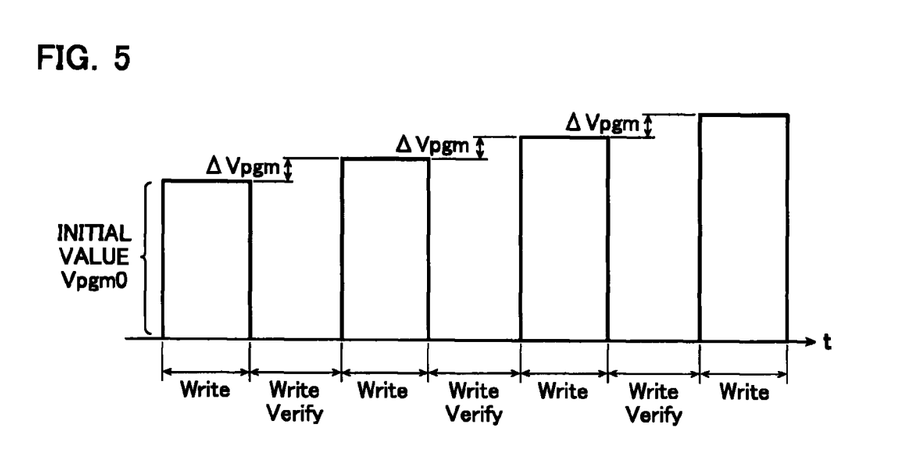
FIG. 5 is a diagram illustrating an aspect in which a program pulse voltage Vpgm is stepped up when the program operation is performed again after the program verify operation.

FIG. 5 is a diagram illustrating an aspect in which the program pulse voltage Vpgm is stepped up when the program operation is performed again after the program verify operation. When the program operation is performed again, the program pulse voltage Vpgm is set to a voltage (Vpgm0+ΔVpgm) which is more than the initial value Vpgm0 by a step-up value ΔVpgm (>0) (see FIG. 5). When there is a memory cell MC to which data is insufficiently written even though the re-setting high program pulse voltage Vpgm=Vpgm0+ΔVpgm is applied, a step-up operation of increasing the program pulse voltage by the step-up value ΔVpgm is performed again (Vpgm=Vpgm0+2×ΔVpgm). Then, the program operation, the program verify operation, and the step-up operation are repeatedly performed until the writing of data is completed. As the number of repetitions increases, the program pulse voltage Vpgm is sequentially stepped up by ΔVpgm. In this embodiment, the program pulse voltage is uniformly stepped up by ΔVpgm, but the invention is not limited thereto. The program pulse voltage Vpgm may be stepped up by any value as long as it can be more than the previous program pulse voltage.

When the program pulse voltage Vpgm is stepped up and then the program operation is performed on the selected memory cell MC, an intermediate voltage Vpass applied to the non-selected memory cells MC may also be stepped up. In this case, there is a concern that an excessively large number of charges would be injected into the selected memory cell MC by the influence of the intermediate voltage Vpass. Next, the influence caused by the intermediate voltage Vpass will be described with reference to comparative examples illustrated in FIGS. 6 and 7.

Figure 6:
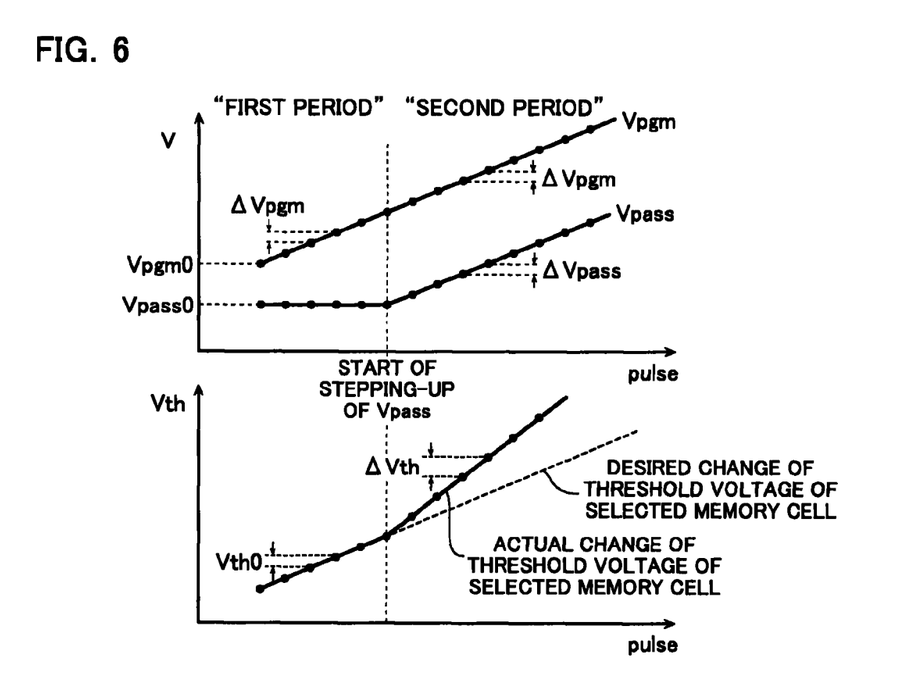
FIG. 6 is a graph illustrating an operation of a nonvolatile semiconductor memory device according to a comparative example.
Figure 7:
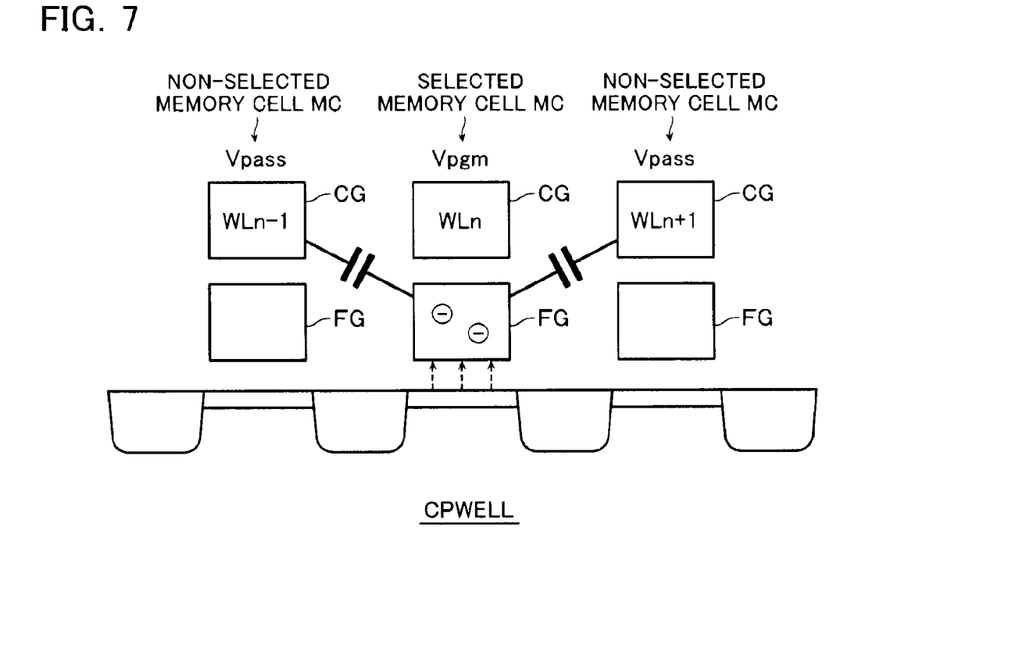
FIG. 7 is a diagram schematically illustrating the operation of the nonvolatile semiconductor memory device according to the comparative example.

FIG. 6 is a graph illustrating an operation of stepping up the program pulse voltage Vpgm and the intermediate voltage Vpass in the comparative example. FIG. 6 illustrates a graph illustrating the program pulse voltage Vpgm and the intermediate voltage Vpass during the program operation along with a graph illustrating a change of the threshold voltage Vth of the selected memory cell MC during the program operation. In FIG. 6, the horizontal axis indicates the number of times a pulse is applied during the program operation. FIG. 7 is a diagram schematically illustrating the influence of the program pulse voltage Vpgm and the intermediate voltage Vpass applied in the program operation on the memory cell MC. FIG. 7 is a cross-sectional view schematically illustrating the memory cells MC. The memory cell MC includes a cell well CPWELL, and a floating gate electrode FG and a control gate electrode CG which are formed on the cell well CPWELL. The control gate electrode CG is a portion of the word line WL which extends in the direction perpendicular to the plane of paper.

As illustrated in FIG. 6, the program pulse voltage Vpgm is set to a voltage Vpgm0 and the program operation starts. A dot on the graph indicates the application of the program pulse voltage Vpgm and the intermediate voltage Vpass. The program verify operation is performed between the dots. For a period (first period) before the number of times the pulse is applied reaches a certain value, the program pulse voltage Vpgm is increased by a step-up value ΔVpgm (first step-up value). For the first period, the intermediate voltage Vpass is maintained to be a constant voltage value Vpass0.

In the program operation for the first period, a change value ΔVth0 of the threshold voltage Vth of the selected memory cell MC is represented by the following Expression 1:

$$\Delta Vth0 = \frac{\partial f}{\partial Vpgm} \cdot \Delta Vpgm \qquad \text{[Expression 1]}$$

(where f is a function indicating the influence of a certain parameter on a change of the threshold voltage Vth of the selected memory cell MC). The parameters of the function f include, for example, a program pulse voltage Vpgm and an intermediate voltage Vpass (Vth=f (Vpgm, Vpass, etc)). Of course, the function f may include other parameters.

When the operation of stepping up the program pulse voltage Vpgm is repeated, the potential difference between the control gate electrode and the channel of a writing inhibition memory cell MC adjacent to the selected word line WL increases and there is a concern that data would be erroneously written to the writing inhibition memory cell MC. In order to prevent data from being erroneously written to the writing inhibition memory cell MC, the intermediate voltage Vpass is stepped up to increase the channel potential of the writing inhibition memory cell MC. As illustrated in FIG. 6, for a period (second period) after the number of times the program pulse voltage Vpgm is applied reaches a certain value (first value), the operation of stepping up the intermediate voltage Vpass starts.

As illustrated in FIG. 6, in the program operation according to the comparative example, the step-up value of the intermediate voltage Vpass is set to ΔVpass. In addition, the program pulse voltage Vpgm is increased by a constant step-up value ΔVpgm, regardless of whether the intermediate voltage Vpass is stepped up.

As illustrated in FIG. 7, the floating gate electrode FG of the selected memory cell MC is affected by the intermediate voltage Vpass applied to the non-selected memory cell MC in addition to the program pulse voltage Vpgm applied to the selected memory cell MC. The potential of the floating gate electrode FG of the selected memory cell MC is increased by capacitance coupling with the non-selected word lines WLn−1 and WLn+1 to which the intermediate voltage Vpass is applied, in addition to capacitance coupling with the selected word line WLn. When the intermediate voltage Vpass is increased by the constant step-up value ΔVpass, the potential of the floating gate electrode FG is largely increased by the influence of the program pulse voltage Vpgm and the intermediate voltage Vpass. Therefore, charges more than the estimated amount are injected into the floating gate electrode FG.

In the program operation for the second period, a change value ΔVth of the threshold voltage Vth of the selected memory cell MC is represented by the following Expression 2:

$$\Delta Vth = \frac{\partial f}{\partial Vpgm} \cdot \Delta Vpgm + \frac{\partial f}{\partial Vpass} \cdot \Delta Vpass. \quad \text{[Expression 2]}$$

As illustrated in the graph illustrating the change of the threshold voltage in FIG. 6, the actual threshold voltage Vth of the selected memory cell MC is changed by a change value ΔVth0 for the first period and is changed by the change value ΔVth for the second period. The change value ΔVth is more than the change value ΔVth0. The threshold voltage Vth of the selected memory cell MC is changed by more than a certain value. When the change value of the threshold voltage is more than the certain value, it is difficult to accurately write data to the selected memory cell MC. In order to solve this problem, the nonvolatile semiconductor memory device according to this embodiment performs the following program operation.

[Operation of Nonvolatile Semiconductor Memory Device According to First Embodiment]

Figure 8:
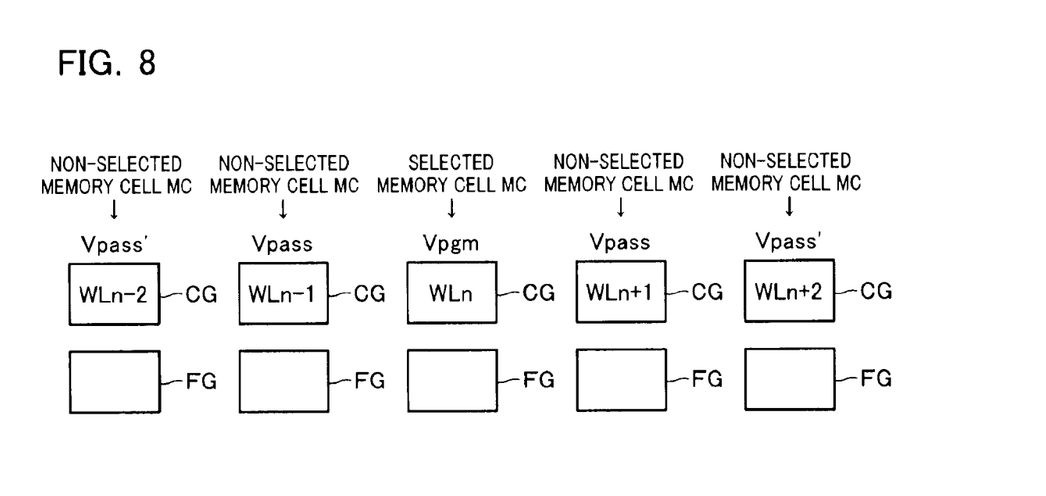
FIG. 8 is a diagram schematically illustrating an operation of a nonvolatile semiconductor memory device according to a first embodiment.
Figure 9:
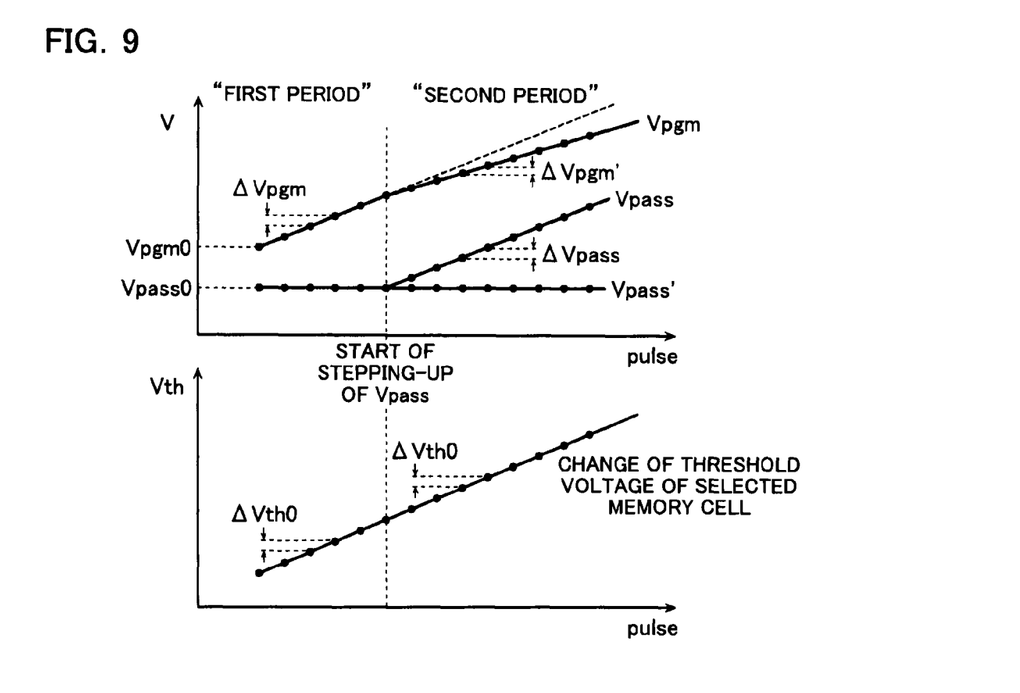
FIG. 9 is a graph illustrating the operation of the nonvolatile semiconductor memory device according to the first embodiment.

FIG. 8 is a diagram illustrating the program pulse voltage Vpgm and intermediate voltages Vpass and Vpass' applied to the memory cells MC in the program operation according to this embodiment. FIG. 9 is a graph illustrating a change of the step-up value ΔVpgm of the program pulse voltage Vpgm. As illustrated in FIG. 8, among the non-selected word lines WL, the intermediate voltage Vpass' is applied to the word lines WL except for the non-selected word lines WLn−1 and WLn+1 adjacent to the selected word line WLn.

The nonvolatile semiconductor memory device according to this embodiment increases the program pulse voltage Vpgm by a value ΔVpgm' different from the step-up value ΔVpgm for the second period. In addition, for the second period, the nonvolatile semiconductor memory device increases the intermediate voltage Vpass by the step-up value ΔVpass. The intermediate voltage Vpass' is maintained to be a constant voltage value Vpass0.

For the second period, the nonvolatile semiconductor memory device according to this embodiment controls the step-up value ΔVpgm' of the program pulse voltage Vpgm on the basis of the following Expression 3:

$$\Delta Vpgm' = \Delta Vth0 - \frac{\frac{\partial f}{\partial Vpass}}{\frac{\partial f}{\partial Vpgm}} \cdot \Delta Vpass. \quad \text{[Expression 3]}$$

Expression 3 illustrates the step-up value ΔVpgm' in which a change value of the threshold voltage Vth of the selected memory cell MC due to the influence of the step-up value ΔVpgm' and the step-up value ΔVpass is set to the certain change value ΔVth0. When the step-up value ΔVpgm' is determined on the basis of the function f and the step-up value ΔVpass with reference to the step-up value ΔVpass, the threshold voltage Vth of the selected memory cell MC may be changed by the change value ΔVth0. In this embodiment, the step-up value ΔVpgm' for the second period is less than the step-up value ΔVpgm for the first period.

The voltage generating circuit 7 may control the voltage values of the step-up value ΔVpgm' and the step-up value ΔVpass. For example, the number of booster circuits BC in the voltage control circuit 7 (see FIG. 1) is changed to control the voltage values of the step-up value ΔVpgm' or the step-up value ΔVpass.

[Effect]

When the step-up value ΔVpgm' of the program pulse voltage Vpgm is changed as in this embodiment, the potential of the floating gate electrode FG increases in small amounts for the second period. Therefore, an excessively large number of charges are not injected into the floating gate electrode FG. As a result, as illustrated in the graph illustrating a change value of the threshold voltage in FIG. 9, the change value of the threshold voltage of the selected memory cell MC is a substantially constant value ΔVth0 for the first period and the second period. Control can be performed such that the threshold voltage of the selected memory cell MC reaches an appropriate value and data can be accurately written to the selected memory cell MC.

In FIG. 9, the step-up value ΔVpgm' of the program pulse voltage Vpgm is constant for the entire second period. However, the step-up value ΔVpgm' of the program pulse voltage Vpgm may be changed in each the step-up operation on the basis of the above-mentioned Expression 3. For example, when the function f considers a change based on the number of times the pulse is applied, the step-up value ΔVpgm' may be changed to each other in the step-up operation for the second period.

Second Embodiment

Next, a nonvolatile semiconductor memory device according to a second embodiment will be described with reference to FIGS. 10 and 11. The entire configuration of the nonvolatile semiconductor memory device according to this embodiment is the same as that in the first embodiment and the detailed description thereof will be omitted. In addition, components having the same structures as those in the first embodiment are denoted by the same reference numerals and the redundant description thereof will be omitted.

In the first embodiment, the same intermediate voltage Vpass and step-up voltage ΔVpass are applied to both the non-selected word lines WLn−1 and WLn+1 adjacent to the selected word line WLn. The second embodiment differs from the first embodiment in that different voltages are applied to the non-selected word line WLn−1 and the non-selected word line WLn+1. Next, a program operation and a step-up operation according to the second embodiment will be described.

[Operation of Nonvolatile Semiconductor Memory Device According to Second Embodiment]

Figure 10:
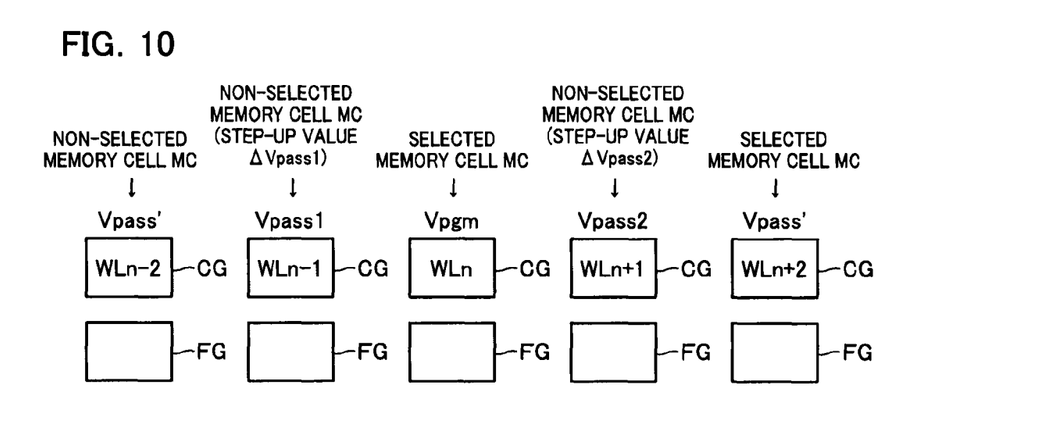
FIG. 10 is a diagram schematically illustrating an operation of a nonvolatile semiconductor memory device according to a second embodiment.

FIG. 10 is a diagram illustrating a program pulse voltage Vpgm and intermediate voltages Vpass1, Vpass2, and Vpass' applied to the memory cells MC in the program operation according to this embodiment. FIG. 11 is a graph illustrating a change of the step-up value ΔVpgm of the program pulse voltage Vpgm. As illustrated in FIG. 10, the intermediate voltage Vpass1 is applied to the non-selected word line WLn−1 adjacent to the selected word line WLn and the intermediate voltage Vpass2 is applied to the non-selected word line WLn+1 adjacent to the selected word line WLn.

The nonvolatile semiconductor memory device according to this embodiment increases the program pulse voltage Vpgm by a value ΔVpgm' different from the step-up value ΔVpgm for the second period. In addition, for the second period, the intermediate voltages Vpass1 and Vpass2 applied to the non-selected word lines WLn−1 and WLn+1 are increased by different step-up values. The intermediate voltage Vpass1 applied to the non-selected word line WLn−1 is increased by a step-up value ΔVpass1 and the intermediate voltage Vpass2 applied to the non-selected word line WLn+1 is increased by a step-up value ΔVpass2. The intermediate voltage Vpass' is maintained to be a constant voltage value Vpass0.

In the program operation for the second period, when the step-up value ΔVpgm' of the program pulse voltage Vpgm is equal to the step-up value ΔVpgm, a change value ΔVth of the threshold voltage Vth of the selected memory cell MC is represented by the following Expression 4:

$$\Delta Vth = \frac{\partial f}{\partial Vpgm} \cdot \Delta Vpgm + \frac{\partial f}{\partial Vpass1} \cdot \Delta Vpass1 + \frac{\partial f}{\partial Vpass2} \cdot \Delta Vpass2. \quad \text{[Expression 4]}$$

Figure 11:
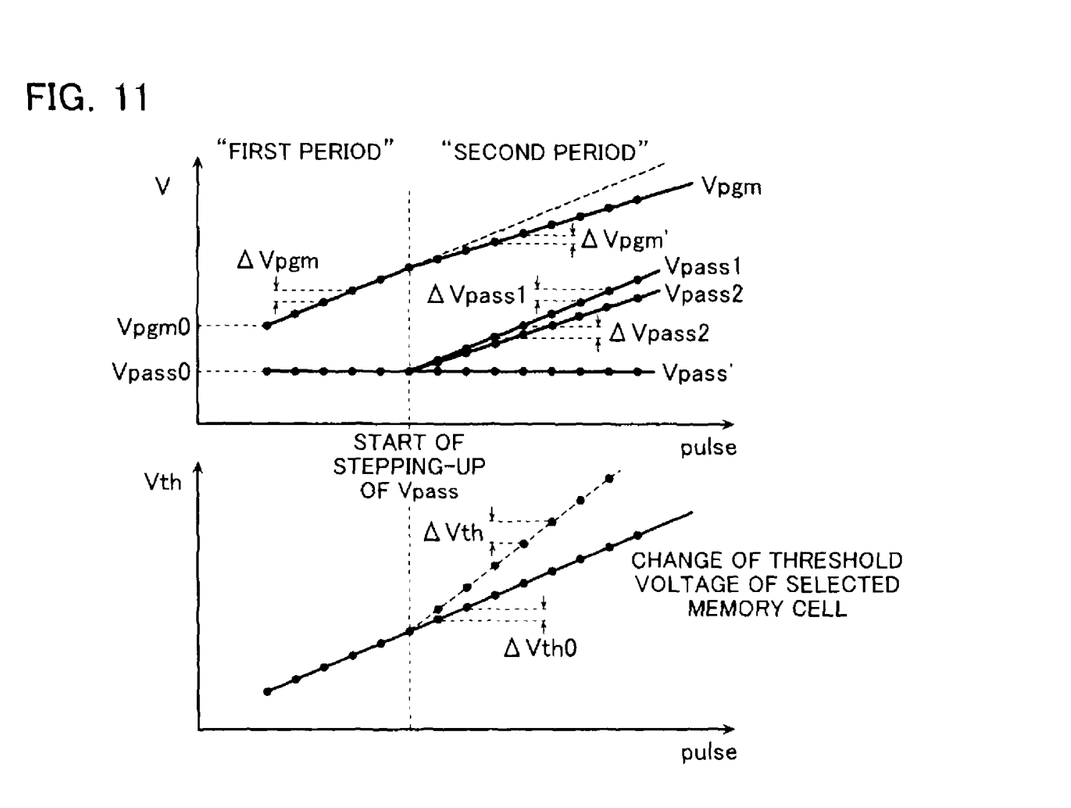
FIG. 11 is a graph illustrating the operation of the nonvolatile semiconductor memory device according to the second embodiment.

As illustrated in the graph illustrating a change of the threshold voltage in FIG. 11, the change value ΔVth is more than the change value ΔVth0 for the first period. For the second period, the nonvolatile semiconductor memory device according to this embodiment controls the step-up value ΔVpgm' of the program pulse voltage Vpgm on the basis of the following Expression 5:

$$\Delta Vpgm' = \Delta Vth0 - \frac{1}{\frac{\partial f}{\partial Vpgm}} \left\{ \frac{\partial f}{\partial Vpass1} \cdot \Delta Vpass1 + \frac{\partial f}{\partial Vpass2} \cdot \Delta Vpass2 \right\}. \quad \text{[Expression 5]}$$

Expression 5 illustrates the step-up value ΔVpgm' in which a change value of the threshold voltage Vth of the selected memory cell MC due to the influence of the step-up value ΔVpgm' and the step-up values ΔVpass1 and ΔVpass2 is set to a certain change value ΔVth0. When the step-up value ΔVpgm' is determined on the basis of the function f and the step-up values ΔVpass1 and ΔVpass2 with reference to the step-up values ΔVpass1 and ΔVpass2, the threshold voltage Vth of the selected memory cell MC may be changed by the change value ΔVth0. In this embodiment, the step-up value ΔVpgm' for the second period is less than the step-up value ΔVpgm for the first period.

[Effect]

When the step-up value ΔVpgm' of the program pulse voltage Vpgm is changed as in this embodiment, the potential of the floating gate electrode FG increases slowly for the second period. Therefore, an excessively large number of charges are not injected into the floating gate electrode FG. As a result, as illustrated in the graph illustrating the change of the threshold voltage in FIG. 11, the change of the threshold voltage of the selected memory cell MC is a substantially constant value ΔVth0 for the first period and the second period. Control can be performed such that the threshold voltage of the selected memory cell MC reaches an appropriate value and data can be accurately written to the selected memory cell MC.

The step-up operation according to this embodiment controls the step-up value ΔVpgm' considering the influence of each of the step-up values ΔVpass1 and ΔVpass2 applied to the word lines WLn−1 and WLn+1 adjacent to the selected word line WLn. Therefore, the step-up value ΔVpgm' of the program pulse voltage Vpgm may be controlled under detailed conditions and data may be accurately written to the selected memory cell MC.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. For example, in the above-described embodiments, the nonvolatile semiconductor device is the two-value data storage type (1 bit/cell), but the invention is not limited thereto. For example, the invention can be applied to a multi-bit storage type, such as a four-value data storage type or an eight-value data storage type.

The function f may include various kinds of parameters, such as an intermediate voltage Vpass' applied to the non-selected word lines WLn−2, WLn+2 and the like which are not adjacent to the selected word line, the step-up start timing of the intermediate voltage Vpass, and the deteriorating state of the memory cell MC. The controller 4 may change the step-up value ΔVpgm' of the program pulse voltage Vpgm on the basis of information about the parameters.

What is claimed is:

1. A nonvolatile semiconductor memory device comprising:
a memory cell array having electrically-rewritable nonvolatile memory cells arranged therein; and
a control unit configured to perform a control of repeating a program operation, a program verify operation, and a step-up operation, the program operation being an operation of applying a program pulse voltage to a selected memory cell in order to write data and applying an intermediate voltage less than the program pulse voltage to first and second non-selected memory cells adjacent to the selected memory cell, the program verify operation being an operation of determining whether the writing of the data is completed, and the step-up operation being an operation of increasing the program pulse voltage by a first step-up value when the writing of the data is not completed,
for a first period for which the number of times the program pulse voltage is applied is less than a first value, the control unit maintaining the intermediate voltage to be a constant value,
for a second period for which the number of times the program pulse voltage is applied is equal to or greater than the first value, the control unit controlling the step-up operation such that the intermediate voltage is increased by a second step-up value, and determining the first step-up value on the basis of the second step-up value.

2. The nonvolatile semiconductor memory device according to claim 1,
wherein the control unit sets the second step-up values of the first and second non-selected memory cells to different values.

3. The nonvolatile semiconductor memory device according to claim 1,
wherein the control unit determines the first step-up value on the basis of the second step-up value for each step-up operation for the second period.

4. The nonvolatile semiconductor memory device according to claim 1,
wherein the first step-up value for the second period is less than the first step-up value for the first period.

5. The nonvolatile semiconductor memory device according to claim 1,
wherein the control unit sets the intermediate voltage applied to non-selected memory cells except for the first and second non-selected memory cells to a constant value during the program operation.

6. The nonvolatile semiconductor memory device according to claim 1,
wherein the control unit determines the first step-up value on the basis of a voltage value of the program pulse voltage and a voltage value of the intermediate voltage.

7. The nonvolatile semiconductor memory device according to claim 1,
wherein the control unit changes the number of booster circuits in the control unit to control voltage values of the first and second step-up values.

8. The nonvolatile semiconductor memory device according to claim 1,
wherein the nonvolatile memory cell has a stacked gate structure, the stacked gate structure including a tunnel insulating film, a floating gate electrode, an inter-gate insulating film, and a control gate electrode stacked on a semiconductor substrate.

9. A nonvolatile semiconductor memory device comprising:
a memory cell array having electrically-rewritable nonvolatile memory cells arranged therein; and
a control unit configured to perform a program operation, the program operation being an operation of applying a program pulse voltage to a selected memory cell in order to write data and applying an intermediate voltage less than the program pulse voltage to first and second non-selected memory cells adjacent to the selected memory cell,
the control unit being configured to change the program pulse voltage and the intermediate voltage, and
the control unit being configured to change the program pulse voltage on the basis of a change value of the intermediate voltage when the program pulse voltage is changed.

10. The nonvolatile semiconductor memory device according to claim 9,
wherein the control unit is configured to perform a control of repeating the program operation, and
wherein the control unit is configured to change the program pulse voltage on the basis of the change value of the intermediate voltage whenever the program operation is repeated.

11. The nonvolatile semiconductor memory device according to claim 9,
wherein the control unit sets the intermediate voltage applied to non-selected memory cells except for the first and second non-selected memory cells to a constant value during the program operation.

12. The nonvolatile semiconductor memory device according to claim 9,
wherein the control unit changes the program pulse voltage on the basis of a voltage value of the intermediate voltage.

13. The nonvolatile semiconductor memory device according to claim 9,
wherein the control unit changes the number of booster circuits in the control unit to control a voltage value of the program pulse voltage and a voltage value of the intermediate voltage.

14. The nonvolatile semiconductor memory device according to claim 9,
wherein the nonvolatile memory cell has a stacked gate structure, the stacked gate structure including a tunnel insulating film, a floating gate electrode, an inter-gate insulating film, and a control gate electrode stacked on a semiconductor substrate.

15. A nonvolatile semiconductor memory device comprising:
a memory cell array having electrically-rewritable nonvolatile memory cells arranged therein; and
a control unit configured to perform a program operation, the program operation being an operation of applying a program pulse voltage to a selected memory cell in order to write data and applying an intermediate voltage less than the program pulse voltage to first and second non-selected memory cells adjacent to the selected memory cell,
the control unit being configured to change the program pulse voltage and the intermediate voltage, and
the control unit being configured to set change values of the intermediate voltage of the first and second non-selected memory cells to different values each other, and change the program pulse voltage on the basis of the change values of the intermediate voltage when the program pulse voltage is changed.

16. The nonvolatile semiconductor memory device according to claim 15,
wherein the control unit is configured to perform a control of repeating the program operation, and
wherein the control unit is configured to change the program pulse voltage on the basis of the change values of the intermediate voltage whenever the program operation is repeated.

17. The nonvolatile semiconductor memory device according to claim 15,
wherein the control unit sets the intermediate voltage applied to non-selected memory cells except for the first and second non-selected memory cells to a constant value during the program operation.

18. The nonvolatile semiconductor memory device according to claim 15,
wherein the control unit changes the program pulse voltage on the basis of a voltage value of the intermediate voltage.

19. The nonvolatile semiconductor memory device according to claim 15,
wherein the control unit changes the number of booster circuits in the control unit to control a voltage value of the program pulse voltage and a voltage value of the intermediate voltage.

20. The nonvolatile semiconductor memory device according to claim 15,
   wherein the nonvolatile memory cell has a stacked gate structure, the stacked gate structure including a tunnel insulating film, a floating gate electrode, an inter-gate insulating film, and a control gate electrode stacked on a semiconductor substrate.

* * * * *